United States Patent
Chen

(10) Patent No.: US 10,340,422 B2
(45) Date of Patent: Jul. 2, 2019

(54) DISPLAY DEVICE AND DISPLAY PANEL

(71) Applicant: SHENZHEN CHINA STAR OPTOELECTRONICS TECHNOLOGY CO., LTD., Guangdong (CN)

(72) Inventor: Lixuan Chen, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 15/735,610

(22) PCT Filed: Nov. 22, 2017

(86) PCT No.: PCT/CN2017/112394
§ 371 (c)(1),
(2) Date: Dec. 12, 2017

(65) Prior Publication Data
US 2019/0140142 A1  May 9, 2019

(30) Foreign Application Priority Data

Nov. 7, 2017 (CN) .......................... 2017 1 1083105

(51) Int. Cl.
*H01L 33/40* (2010.01)
*H01L 25/075* (2006.01)
*H01L 33/62* (2010.01)
*H01L 27/12* (2006.01)
*H01F 7/20* (2006.01)

(52) U.S. Cl.
CPC .......... *H01L 33/40* (2013.01); *H01L 25/0753* (2013.01); *H01L 27/1214* (2013.01); *H01L 33/62* (2013.01); *H01F 7/20* (2013.01)

(58) Field of Classification Search
CPC ..... H01L 33/40; H01L 33/62; H01L 27/1214; H01L 25/0753; H01F 7/20
See application file for complete search history.

(56) References Cited

U.S. PATENT DOCUMENTS

| | | | | |
|---|---|---|---|---|
| 2008/0277677 A1* | 11/2008 | Kuo | .......................... | G09F 9/33 257/91 |
| 2012/0204404 A1* | 8/2012 | Kim | .................... | G02F 1/13336 29/428 |
| 2014/0189982 A1* | 7/2014 | Li | .......................... | A44B 99/00 24/303 |
| 2014/0192292 A1* | 7/2014 | Li | ........................ | G02B 6/0088 349/65 |

(Continued)

FOREIGN PATENT DOCUMENTS

| CN | 105493298 A | 4/2016 |
|---|---|---|
| CN | 106847796 A | 6/2017 |
| CN | 107026124 A | 8/2017 |

*Primary Examiner* — Yosef Gebreyesus
(74) *Attorney, Agent, or Firm* — Mark M. Friedman

(57) ABSTRACT

A display device and a display panel are provided. The display panel includes an array panel and a plurality of display devices. The display device includes a display device main body and a magnetic member disposed on the display device main body. The display device can be transferred to the array panel under a force of a magnetic field outside of the display device. The present disclosure can efficiently transfer the display devices to the array panel.

17 Claims, 4 Drawing Sheets

(56) References Cited

U.S. PATENT DOCUMENTS

| | | | |
|---|---|---|---|
| 2016/0211415 A1* | 7/2016 | Huang | H01L 24/00 |
| 2017/0062400 A1 | 3/2017 | Li et al. | |
| 2017/0075165 A1* | 3/2017 | Kato | G02F 1/133512 |
| 2017/0148771 A1 | 5/2017 | Cha et al. | |
| 2017/0330867 A1 | 11/2017 | Zou et al. | |

* cited by examiner

DISPLAY DEVICE AND DISPLAY PANEL

FIELD OF INVENTION

The present disclosure relates to a technical field of displays, and more particularly to a display device and a display panel.

BACKGROUND OF INVENTION

With development of technology, in part of array panels, it is necessary to embed a plurality of display devices therein, such as micro light-emitting diodes (LED).

Conventional display devices are disposed on an array panel by the following technical solution:

In using a device transferring equipment, the display devices that are waiting to be disposed, are aligned to predetermined positions of the array panel, and then are transferred to the array panel.

Efficiency of the above-mentioned technical solution is low.

In order to improve efficiency of transferring the display devices to the array panel, an improved technical solution uses a magnetic field to transfer the display devices to the array panel.

However, the conventional display devices are not suitable the above-mentioned technical solution which uses a magnetic field to transfer the display devices. Hence, it is necessary to improve the display devices, which are to be efficiently transferred to the array panel in the magnetic field.

SUMMARY OF INVENTION

The present disclosure provides a display device and a display panel, so as to efficiently transfer the display devices to an array panel of the display panel.

For solving the above-mentioned problem, the present disclosure provides technical solutions as follows.

A display device, which comprises a display device main body; and a magnetic member disposed on the display device main body; wherein the display device is assembled by the display device main body and the magnetic member, and is configured to be transferred to an array panel under a force of a magnetic field outside of the display device, so that the display devices and the array panel compose a display panel; the magnetic member is disposed in at least one end of the display device main body; and the magnetic member is configured to allow a predetermined portion of the display device to contact the array panel when the display device is transferred to the array panel.

In the above-mentioned display device, the display device transferred to the array panel becomes a display unit of the display panel.

In the above-mentioned display device, the magnetic member is a magnetic conductive material layer, which is formed by disposing a magnetic conductive material in the at least one end of the display device main body.

In the above-mentioned display device, the display device main body includes a first electrode and a second electrode; and the first electrode and the second electrode are respectively disposed on two opposite-direction surfaces of the display device main body; or the first electrode and the second electrode are respectively disposed on two same-direction surfaces of the display device main body.

A display device, which comprises: a display device main body; and a magnetic member disposed on the display device main body; wherein the display device is assembled by the display device main body and the magnetic member, and is configured to be transferred to an array panel under a force of a magnetic field outside of the display device, so that the display devices and the array panel compose a display panel.

In the above-mentioned display device, the display device transferred to the array panel becomes a display unit of the display panel.

In the above-mentioned display device, the magnetic member is disposed in at least one end of the display device main body.

In the above-mentioned display device, the magnetic member is a magnetic conductive material layer, which is formed by disposing a magnetic conductive material in the at least one end of the display device main body.

In the above-mentioned display device, the magnetic member is configured to allow a predetermined portion of the display device to contact the array panel when the display device is transferred to the array panel.

In the above-mentioned display device, the display device main body includes a first electrode and a second electrode; and the first electrode and the second electrode are respectively disposed on two opposite-direction surfaces of the display device main body; or the first electrode and the second electrode are respectively disposed on two same-direction surfaces of the display device main body.

In the above-mentioned display device, when the first electrode and the second electrode are respectively disposed on the two opposite-direction surfaces of the display device main body, the magnetic member is disposed on the first electrode or the second electrode of the display device main body.

In the above-mentioned display device, when the first electrode and the second electrode are respectively disposed on the two same-direction surfaces of the display device main body, the magnetic member is disposed on the first electrode or the second electrode of the display device main body.

A display panel, comprises: an array panel; and a plurality of display devices, each of the display devices comprises: a display device main body; and a magnetic member disposed on the display device main body; wherein the display device is assembled by the display device main body and the magnetic member, and is configured to be transferred to the array panel under a force of a magnetic field outside of the display device, so that the display devices and the array panel compose the display panel.

In the above-mentioned display panel, one of the display devices transferred to the array panel becomes a display unit of the display panel.

In the above-mentioned display panel, the magnetic member is disposed in at least one end of the display device main body.

In the above-mentioned display panel, the magnetic member is a magnetic conductive material layer, which is formed by disposing a magnetic conductive material in the at least one end of the display device main body.

In the above-mentioned display panel, the magnetic member is configured to allow a predetermined portion of the display device to contact the array panel when the display device is transferred to the array panel.

In the above-mentioned display panel, the display device main body includes a first electrode and a second electrode; and the first electrode and the second electrode are respectively disposed on two opposite-direction surfaces of the display device main body; or the first electrode and the second electrode are respectively disposed on two same-direction surfaces of the display device main body.

In the above-mentioned display panel, when the first electrode and the second electrode are respectively disposed on the two opposite-direction surfaces of the display device main body, the magnetic member is disposed on the first electrode or the second electrode of the display device main body.

In the above-mentioned display panel, when the first electrode and the second electrode are respectively disposed on the two same-direction surfaces of the display device main body, the magnetic member is disposed on the first electrode or the second electrode of the display device main body.

Compared with the prior art, because a display device of the present disclosure further includes a magnetic member, and the magnetic member is disposed on a display device main body, the display device assembled by the display device main body and the magnetic member can be transferred to an array panel under a force of a magnetic field outside of the display device. Therefore, the present disclosure can efficiently transfer the display devices to the array panel of a display panel.

To make the above content of the present invention more comprehensible, the preferred embodiments below with the accompanying drawings are described in detail.

DETAILED DESCRIPTION OF PREFERRED EMBODIMENTS

Figure 1:
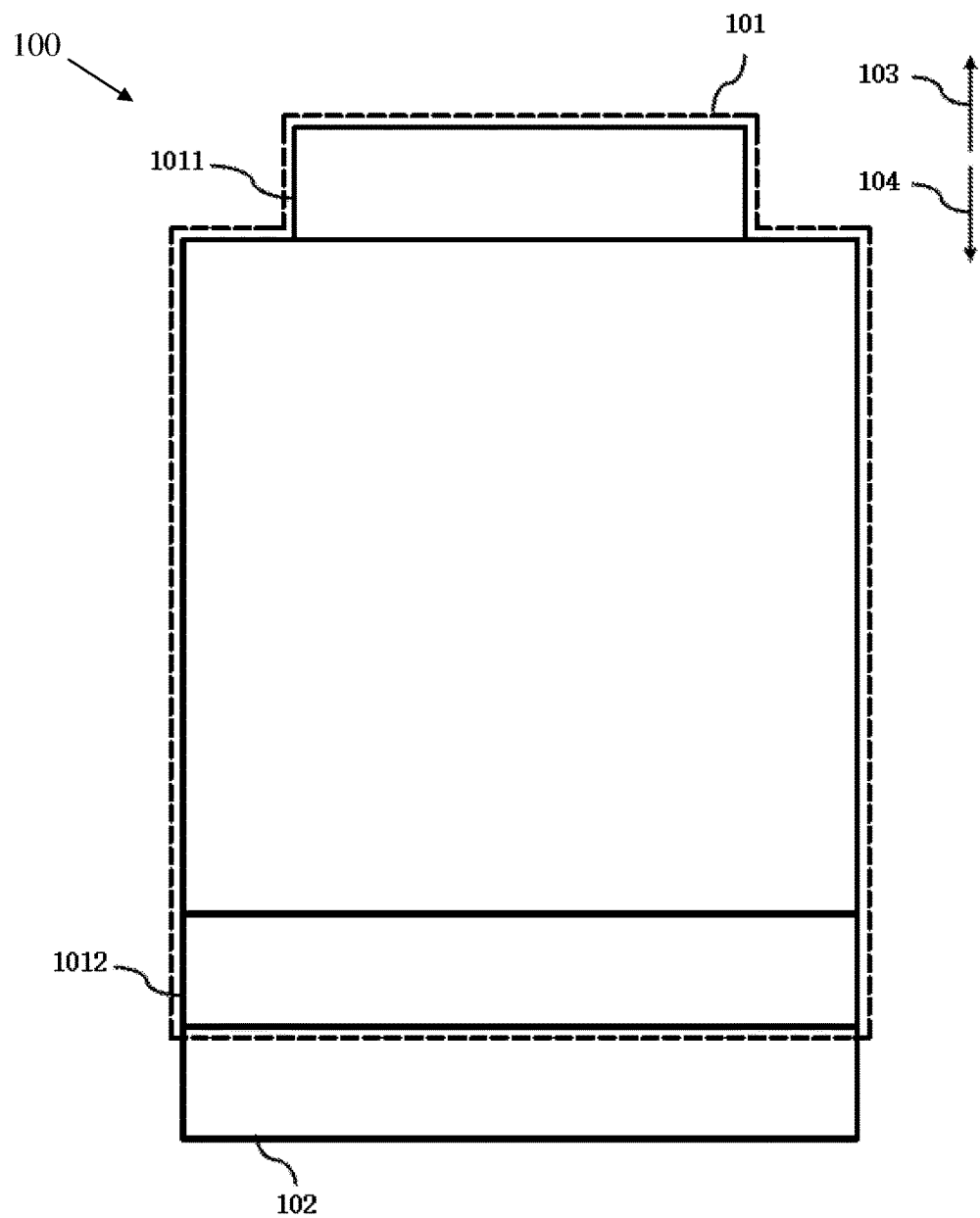
FIG. 1 is a schematic view of a display device according to a first embodiment of the present disclosure.

The term "embodiment" used in this description refers to an example, a demonstration, or an illustration. In addition, the two indefinite articles "a" and "an" used in this description and claims are generally understood as "one" or "more/a plurality of" unless a specific single form is pointed out or is determined in the context.

A display panel 1 of the present disclosure includes an array panel 10 and a plurality of display devices 100. The display devices 100 are transferred to the array panel 10 by a device transferring equipment.

One of the display devices of the present disclosure includes a display device main body 101 and a magnetic member 102. The display device main body 101, for example, can be a micro light-emitting diode (LED).

The magnetic member 102 is disposed on the display device main body 101.

The display device assembled by the display device main body 101 and the magnetic member 102 can be transferred to the array panel under a force of a magnetic field outside of the display device, so that the display devices and the array panel compose the display panel.

One of the display devices transferred to the array panel becomes a display unit of the display panel.

The magnetic member 102 is disposed in at least one end of the display device main body 101.

The magnetic member 102 is a magnetic conductive material layer, which is formed by disposing a magnetic conductive material in the at least one end of the display device main body 101.

The magnetic member 102 is used to allow a predetermined portion of the display device to contact the array panel when the display device is transferred to the array panel.

The magnetic conductive material can be a metal, such as iron (Fe), nickel (Ni), and cobalt (Co), or it can be a Fe—Ni—Co oxide, a Fe—Ni—Co chemical compound, or a Fe—Ni—Co alloy.

The magnetic member 102 made by the magnetic conductive material is used to accept a magnetic pull force or a magnetic push force of a magnetic field.

The display device main body 101 includes a first electrode 1011 and a second electrode 1012.

The first electrode 1011 and the second electrode 1012 are disposed on two opposite-direction surfaces of the display device main body 101, respectively. That is, the first electrode 1011 and the second electrode 1012 are respectively disposed on a first surface and a second surface of the display device main body 101. The first surface and the second surface are surfaces of the display device main body 101 along a first direction 103 and a second direction 104, respectively. The first direction 103 and the second direction 104 are opposite. As shown in FIG. 1, the magnetic member 102 is disposed (attached) on the first electrode 1011 or the second electrode 1012 of the display device main body 101.

In another way, the first electrode 1011 and the second electrode 1012 are disposed on two same-direction surfaces of the display device main body 101, respectively. That is, the first electrode 1011 and the second electrode 1012 are respectively disposed on a third surface and a fourth surface of the display device main body 101. The third surface and the fourth surface are surfaces of the display device main body 101 along a third direction (parallel with the first direction 103 or the second direction 104). The third surface and the fourth surface are in the same plane, or the third surface and the fourth surface are respectively two stepped surfaces, which are disposed in a step shape, of the display device main body 101 along the third direction. The magnetic member 102 is disposed (attached) on the first electrode 1011 or the second electrode 1012 of the display device main body 101.

Figure 2:
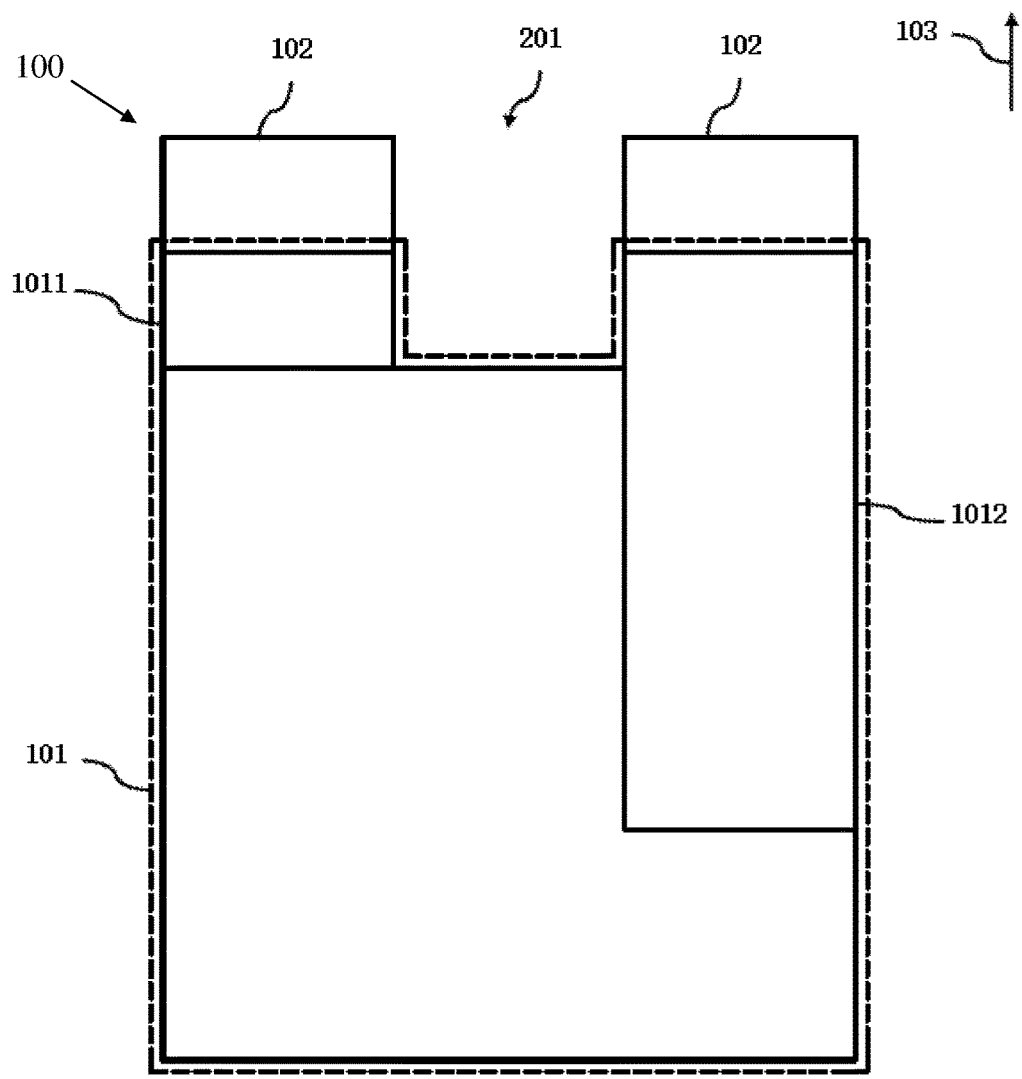
FIG. 2 is a schematic view of a display device according to a second embodiment of the present disclosure.

In the situation that the third surface and the fourth surface are in the same plane, or the third surface and the fourth surface are respectively two stepped surfaces, which are disposed in a step shape, of the display device main body 101 along the third direction, the first electrode 1011 and the second electrode 1012 are respectively disposed on the third surface and the fourth surface and have a predetermined distance in a direction perpendicular to the third direction. As shown in FIG. 2, specifically, in the situation that the third surface and the fourth surface are in the same plane, there is a groove 201 between the third surface and the fourth surface.

Figure 3:
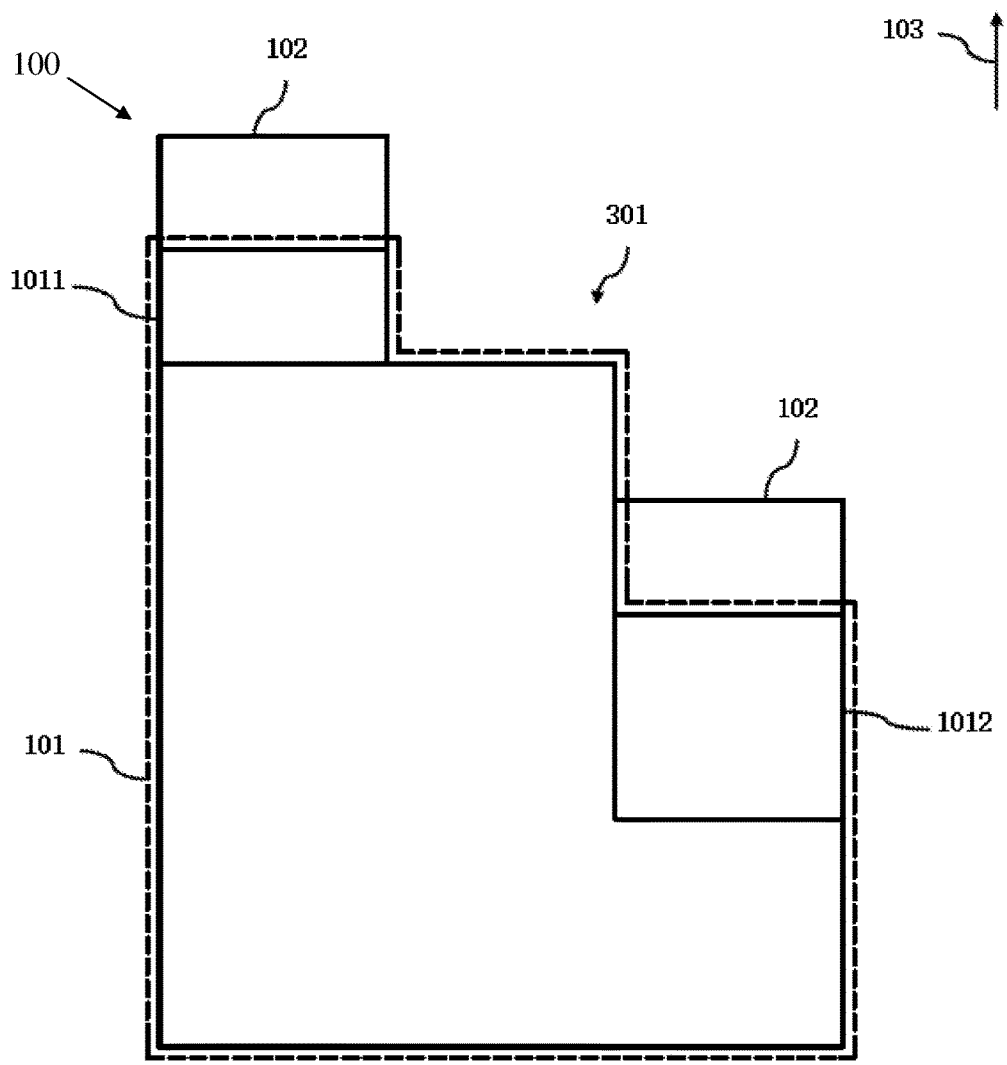
FIG. 3 is a schematic view of a display device according to a third embodiment of the present disclosure.
Figure 4:
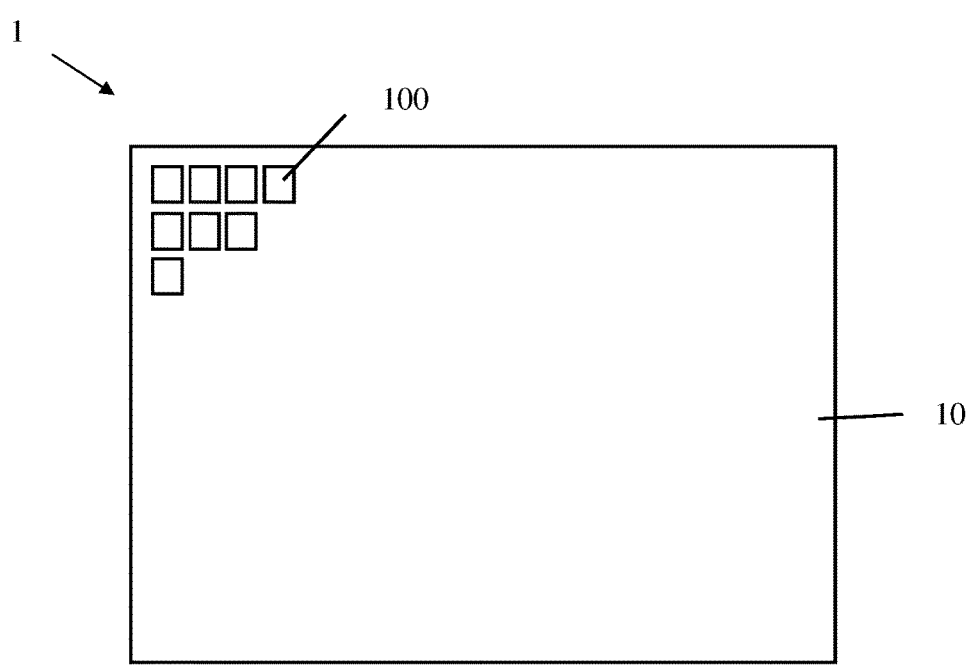
FIG. 4 is a schematic view of a display device of the present disclosure.

In the situation that the third surface and the fourth surface are respectively two stepped surfaces, which are disposed in a step shape, of the display device main body 101 along the third direction, there is a step 301 spacing between the third surface and the fourth surface in the third direction or in the direction perpendicular to the third direction (as shown in FIG. 3).

The magnetic member 102 is used to give a force to the display device main body 101 under a magnetic field. The magnetic member 102 is used to give a force to at least one side of the display device main body 101 under the magnetic field, so as to allow a predetermined portion of the display device to contact the array panel.

In the present disclosure, an electrode/electrode assistant layer of a micro LED is made of a magnetic conductive material.

No matter whether a horizontal structure or a vertical structure, after a semiconductor process, anode electrodes and cathode electrodes are disposed by a sputtering or depositing process. For example, in a horizontal structure, after a common LED is disposed anode and cathode electrodes, one end of the LED is disposed one layer of the magnetic conductive material, such as a metal of iron (Fe), nickel (Ni), cobalt (Co), or a Fe—Ni—Co oxide, a Fe—Ni—Co chemical compound, or a Fe—Ni—Co alloy. The purpose of the magnetic conductive material layer is used to allow the end of the LED to be attracted by a magnet.

In a micro LED of a horizontal structure, which is different from a micro LED of a vertical structure, after the anode and cathode electrodes are finished, it is necessary to dispose one layer of the magnetic conductive material.

By adding a magnetic conductive layer outside of the electrode, using magnetic force to control the micro LED is possible.

By the above-mentioned technical solution, because a display device of the present disclosure further includes a magnetic member 102, and the magnetic member 102 is disposed on a display device main body 101, the display device assembled by the display device main body 101 and the magnetic member 102 can be transferred to an array panel under a force of a magnetic field outside of the display device. Therefore, the present disclosure can efficiently transfer the display devices to the array panel of a display panel.

The present disclosure has been described with preferred embodiments thereof and it is understood that many changes and modifications to the described embodiment can be carried out without departing from the scope and the spirit of the invention that is intended to be limited only by the appended claims.

What is claimed is:

1. A display device, comprising:
a display device main body; and
a magnetic member disposed on the display device main body;
wherein the display device is assembled by the display device main body and the magnetic member, and is configured to be transferred to an array panel under force of a magnetic field outside of the display device, so that the display device and the array panel compose an LED display panel;
the magnetic member is disposed in at least one end of the display device main body; and
the magnetic member is configured to allow a predetermined portion of the display device to contact the array panel when the display device is transferred to the array panel.

2. The display device according to claim 1, wherein the magnetic member is a magnetic conductive material layer, which is formed by disposing a magnetic conductive material in the at least one end of the display device main body.

3. The display device according to claim 1, wherein the display device main body includes a first electrode and a second electrode; and the first electrode and the second electrode are disposed on two respective opposite-direction surfaces of the display device main body; or the first electrode and the second electrode are disposed on respective two same-direction surfaces of the display device main body.

4. A display device, comprising:
a display device main body; and
a magnetic member disposed on the display device main body;
wherein the display device is assembled by the display device main body and the magnetic member, and is configured to be transferred to an array panel under a force of a magnetic field outside of the display device, so that the display device and the array panel compose an LED display panel.

5. The display device according to claim 4, wherein the magnetic member is disposed in at least one end of the display device main body.

6. The display device according to claim 5, wherein the magnetic member is a magnetic conductive material layer, which is formed by disposing a magnetic conductive material in the at least one end of the display device main body.

7. The display device according to claim 4, wherein the magnetic member is configured to allow a predetermined portion of the display device to contact the array panel when the display device is transferred to the array panel.

8. The display device according to claim 4, wherein the display device main body includes a first electrode and a second electrode; and
the first electrode and the second electrode are respectively disposed on two opposite-direction surfaces of the display device main body; or the first electrode and the second electrode are respectively disposed on two same-direction surfaces of the display device main body.

9. The display device according to claim 8, wherein when the first electrode and the second electrode are respectively disposed on the two opposite-direction surfaces of the display device main body, the magnetic member is disposed on the first electrode or the second electrode of the display device main body.

10. The display device according to claim 8, wherein when the first electrode and the second electrode are respectively disposed on the two same-direction surfaces of the display device main body, the magnetic member is disposed on the first electrode or the second electrode of the display device main body.

11. An LED display panel, comprising:
an array panel; and
a plurality of display devices, each of the plurality display devices comprising:
a display device main body; and
a magnetic member disposed on the display device main body;
wherein the display device is assembled by the display device main body and the magnetic member, and is configured to be transferred to the array panel under a force of a magnetic field outside of the display device, so that the plurality display devices and the array panel compose the LED display panel.

12. The LED display panel according to claim 11, wherein the magnetic member is disposed in at least one end of the display device main body.

13. The LED display panel according to claim 12, wherein the magnetic member is a magnetic conductive material layer, which is formed by disposing a magnetic conductive material in the at least one end of the display device main body.

14. The LED display panel according to claim 11, wherein the magnetic member is configured to allow a predetermined portion of the plurality display devices to contact the array panel when the plurality display devices are transferred to the array panel.

15. The LED display panel according to claim 11, wherein the display device main body includes a first electrode and a second electrode; and
   the first electrode and the second electrode are respectively disposed on two opposite-direction surfaces of the display device main body; or the first electrode and the second electrode are respectively disposed on two same-direction surfaces of the display device main body.

16. The LED display panel according to claim 15, wherein when the first electrode and the second electrode are respectively disposed on the two opposite-direction surfaces of the display device main body, the magnetic member is disposed on the first electrode or the second electrode of the display device main body.

17. The LED display panel according to claim 15, wherein when the first electrode and the second electrode are respectively disposed on the two same-direction surfaces of the display device main body, the magnetic member is disposed on the first electrode or the second electrode of the display device main body.

* * * * *